Figure 1:
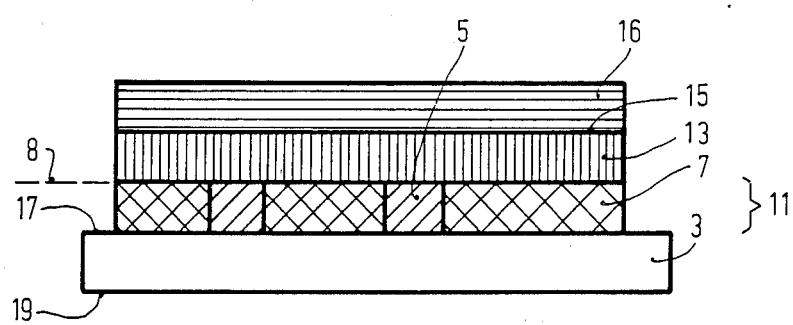

United States Patent [19]

Schnitker et al.

[11] Patent Number: 4,839,775
[45] Date of Patent: Jun. 13, 1989

[54] THICK-FILM CIRCUIT ARRANGEMENT HAVING A CERAMIC SUBSTRATE PLATE

[75] Inventors: Wolfgang E. Schnitker, Krefeld; Michael P. J. Nover, Essen; Kay Appel, Monchen-Gladbach, all of Fed. Rep. of Germany

[73] Assignee: U.S. Philips Corporation, New York, N.Y.

[21] Appl. No.: 208,853

[22] Filed: Jun. 14, 1988

Related U.S. Application Data

[63] Continuation of Ser. No. 7,154, Jan. 27, 1987, abandoned.

[30] Foreign Application Priority Data

Jan. 31, 1986 [DE] Fed. Rep. of Germany ....... 3602960

[51] Int. Cl.$^4$ .............................................. H05K 1/16
[52] U.S. Cl. ................... 361/402; 174/68.5; 235/492; 361/406
[58] Field of Search ............... 174/68.5; 361/402, 404, 361/406; 235/487, 488, 492

[56] References Cited

U.S. PATENT DOCUMENTS

| | | | |
|---|---|---|---|
| 3,564,214 | 2/1971 | Cooper | 235/492 X |
| 4,202,007 | 5/1980 | Dougherty et al. | 174/68.5 X |
| 4,434,361 | 2/1984 | Meinguss et al. | 235/492 |
| 4,487,993 | 12/1984 | Becker | 174/68.5 |
| 4,593,384 | 6/1986 | Kleinjne | 235/492 X |
| 4,650,923 | 3/1987 | Nishigaki et al. | 174/68.5 |

FOREIGN PATENT DOCUMENTS 2016485  4/1970  Fed. Rep. of Germany ...... 235/492

Primary Examiner—R. R. Kucia
Attorney, Agent, or Firm—Paul R. Miller

[57] ABSTRACT

The invention relates to a thick-film circuit arrangement having an electronic circuit which is constructed on a surface (17) of a ceramic substrate plate (3) and which consists of conductor paths (5), resistors, capacitors and components, in particular integrated switching circuits without a housing, formed according to thick-film technique. This structure has between the electrically conductive structures (5) a sintered, nonconductive paste substantially filling the intermediate spaces between them and both the structures and the interposed pastes are covered by a sintered insulating paste. For concealing the thick-film circuit arrangement from unauthorized access, the following covering construction is carried out:

1. the paste in the intermediate spaces fills the same between the electrically active thick-film conductor structures in such a manner that the tops of the electrically active structures and the insulating filling layer (7) formed from an insulating paste and filling the intermediate spaces between them are situated substantially in one plane, and
2. the insulating paste is provided over the combined conductor/filling layer (11) in a covering and smoothing manner to form at least one insulating first thick-film anti-access layer (13) which, by additional observation-impeding inclusions (dyes, particles) impedes an optical recognition of the underlying structures, especially when the first thick-film anti-access layer or layers is or are not succeeded by further anti-access layers.

42 Claims, 3 Drawing Sheets

THICK-FILM CIRCUIT ARRANGEMENT HAVING A CERAMIC SUBSTRATE PLATE

This application is a continuation application of previous application Ser. No. 7154, filed Jan. 27, 1987, now abandoned, and all benefits for such earlier application are hereby claimed for this new continuation application.

The invention relates to a thick-film circuit arrangement having an electronic circuit which is constructed on the front of a ceramic substrate plate and which consists of conductor paths, formed according to thick-film technology, as well as resistors, capacitors and components. In particular, integrated circuits are provided without a housing having a sintered, non-conductive paste substantially filling the intermediate spaces between the conductor structures, and both the conductor structures and the interposed paste are covered with a sintered insulating paste.

Such thick-film circuit arrangements are known from the book "Thick-Film Hybrid Microcircuit Technology," 1983, page 70, by D. W. Hamer and J. V. Biggers; and they are used to reach a high component density on comparatively small surface areas.

In these thick-film circuit boards which are formed from sintered layers on a ceramic substrate plate, the sintered insulating coverings consist substantially of glass; and they are used as so-called multi-layer arrangements to insulate crossing conductor paths in the overlapping area from each other. These insulating thick-film pastes covering conductor paths or resistors, when sintered, can withstand temperatures above the decomposition temperature of organic substances and can withstand all known organic solvents. It is also known to coat thick-film circuits entirely or partly with a coating of an epoxy resin or other organic layers (for example, on the basis of silicone or polyurethane). However, these coatings conceal the underlying structures very unsatisfactorily. A person skilled in the art can remove these coatings without difficulties by heating or dissolving or by a combination of these softening methods, after which the total structure of the thick-film circuit with conductor paths and components is exposed.

The known thick-film circuit arrangements are constructed so that third parties, who either want to copy the circuit arrangement or, for example, want to obtain electronic signals or storage data of the circuit arrangement or subsequent circuit units, can scan with simple means, for example, via test probes by means of scratching or drilling, and obtain all that is interesting for them. Within the scope of increasing electronic data storage, for example, in banking businesses or authorities, the problem presents itself that persons who are interested in the data, for example, bank accounts, personnel data, or the like, will try to obtain illegally on such data. So it becomes more and more important that the access to circuit arrangements which electronically process and convert and encode, respectively, data which are worthly of protection is impeded as much as possible. The higher the access safety of such circuit arrangements and their internal data guiding systems, the more expensive the intellectual and machine investments to be used by so-called intruders to obtain the desired information on the mode of functioning of the circuit arrangement and optionally perform operations by optical analyses, such as observation in transmitted light, exposure to, for example, Xrays, or the reading of electric signals.

It is the object of the invention to improve the access safety of a thick-film circuit arrangement in such a manner that the time, which is necessary for intruding into the circuit arrangement, i.e. to find out the complete mode of operation of the circuit arrangement by obtaining the conductor path pattern between the individual components as well as the reading of the electrical signals, is considerably increased in accordance with the desired safety requirements and that in the case of higher safety requirements, the technique and time available for intruding into the circuit arrangement also exceed the span which is available for professionals as much as possible.

According to the invention this object is achieved in that for covering the circuit arrangement or essential parts thereof the following construction for covering is used:

1. the paste in the intermediate spaces fills the same between the electrically operative thick-film structures in such a manner that the tops of the electrically active structures and of the insulating filling layer formed from an insulating paste and filling the intermediate spaces between them are situated substantially in one plane, and 2. the insulating paste is provided over the combined conductor/filling layer according to (1) in a covering and smoothing manner to form at least one insulating first thick-film anti-access layer which, by additional observation-impeding inclusions (dye, particles), impedes optical recognition of the underlying structures, especially when the first thick-film anti-access layer(s) is (are) not succeeded by further anti-access layers of different structures.

It is known per se from the already mentioned book "Thick-Film Hybrid Microcircuit Technology", page 70, to provide between the sintered conductor structures a sintered, non-conductive paste which substantially fills the intermediate spaces between them and to coat both the conductor structures and the interposed paste with an insulating paste. However, such insulating structures only serve to provide the distance to overlying conductor structures even of the same circuit arrangement.

Such a thick-film arrangement is safeguarded against unauthorized access to a considerable extent. For unauthorized access it would be of importance that first the circuit pattern and hence the connections between the concrete components can be established. Recognition is considerably impeded by a substantially flat surface of the thick-film substrate plate. By dyeing the paste and/or insulating particle inclusions to be sintered the possibility of observing the circuit arrangement is precluded.

According to a further embodiment of the invention it is provided that the first thick-film anti-access layer is covered by at least one second thick-film anti-access layer which is constructed so as to be at least partly superficially conductive and/or at least partly comprise conductor structures which are electrically operative and/or inoperative.

It is known per se from the book "Thick-Film Hybrid Microcircuit Technology", 1983, page 70, to provide a second conductor structure over the insulating layer; however, since this second conductor structure relates to conductor bridges it forms part of the underlying first conductor structure.

According to a further embodiment of the invention the layer structure and the coating of the second thick-film anti-access layer, in so far as conductor structures are present, is done in accordance with the characterizing features (1) and (2) described above. In this manner, unauthorized access is even further impeded.

According to a further embodiment of the invention the layer structure according to the characterising feature described above and optionally below this structure is repeated at least once over each other. In this manner, a multilayer conductor structure can be achieved within the scope of improved access safety.

According to a further embodiment of the invention the second thick-film anti-access layer is constructed in the form of electrically conductive structures which at least partly engage in the electronic circuit of the circuit arrangement at places which are specific of the function. Preferably this may be done in such a manner that the second thick-film anti-access layer engages in the electronic circuit of the circuit arrangement in such a manner that, in the case of interruptions or short-circuits of the structures of the second antiaccess layer, function defects, such as storage loss or storage erasing, are produced in integrated circuits of the circuit arrangement. In this connection it is also possible that the original conductor structures of the circuit arrangement and the overlying antiaccess structures are formed so that in the case of examination with rays penetrating through the material the functioning of the structures cannot be recognized. The analysis of circuit arrangements with improved access safety against X-rays or other ionising rays is thus considerably impeded. For the further improvement of the access safety one or more of the second thick-film anti-access layers may be combined.

According to a further embodiment of the invention a circuit construction with a covering in the same manner as on the front is provided on the rear side of the ceramic substrate plate. It is also possible, however, that at least one second thick-film anti-access layer optionally in combination with at least one filling or a first anti-access layer is provided on the rear side of the substrate plate. In this manner it is avoided that an intruder may obtain the actual circuit pattern from the rear side of the ceramic substrate plate.

According to a further embodiment of the invention the thick-film filling layer filling the intermediate spaces of the electrically operative thick-film structures is a sintered thick-film glass layer. According to a further embodiment of the invention it is also possible that the covering and smoothing first thick-film anti-access layer consists of a sintered thick-film glass layer. In this manner, for achieving the access safety, the known film formation within the scope of the thick-film technology may be used.

The second anti-access layer can be formed in various manners dependent on how high are the requirements for the access safety. For example, if only parts of the circuit arrangement are in danger, the second thick-film anti-access layer is formed entirely or in one or several surfaces from a sintered thick-film conductor and/or resistor paste. When the safety requirements are increased, the structures of the second anti-access layers are formed as a meander, as a comb, as a spiral or as circuit patterns. A further improvement of the access safety is achieved when the conductors of the circuit patterns from the second anti-access layer for delusion purposes form connections which are necessary and/or superfluous for the functions and/or which simulate a different function.

Figure 2:
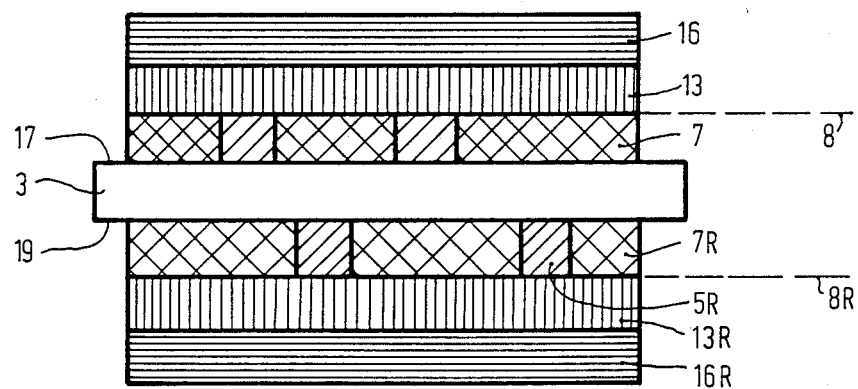
Figure 5:
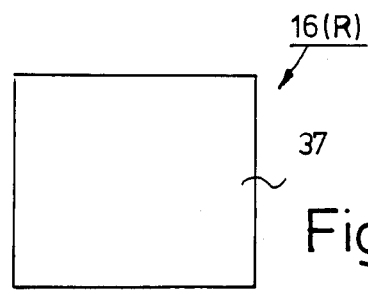
Figure 3:
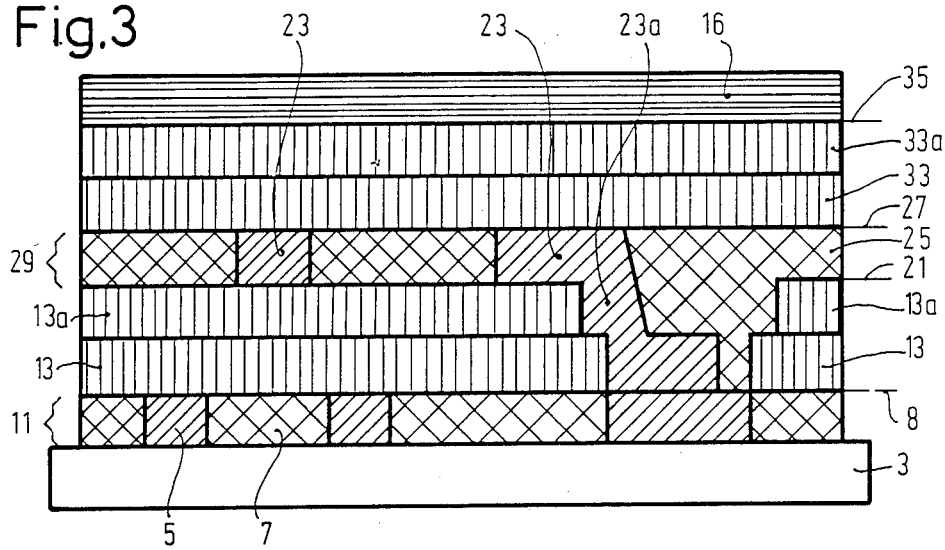
Figure 4:
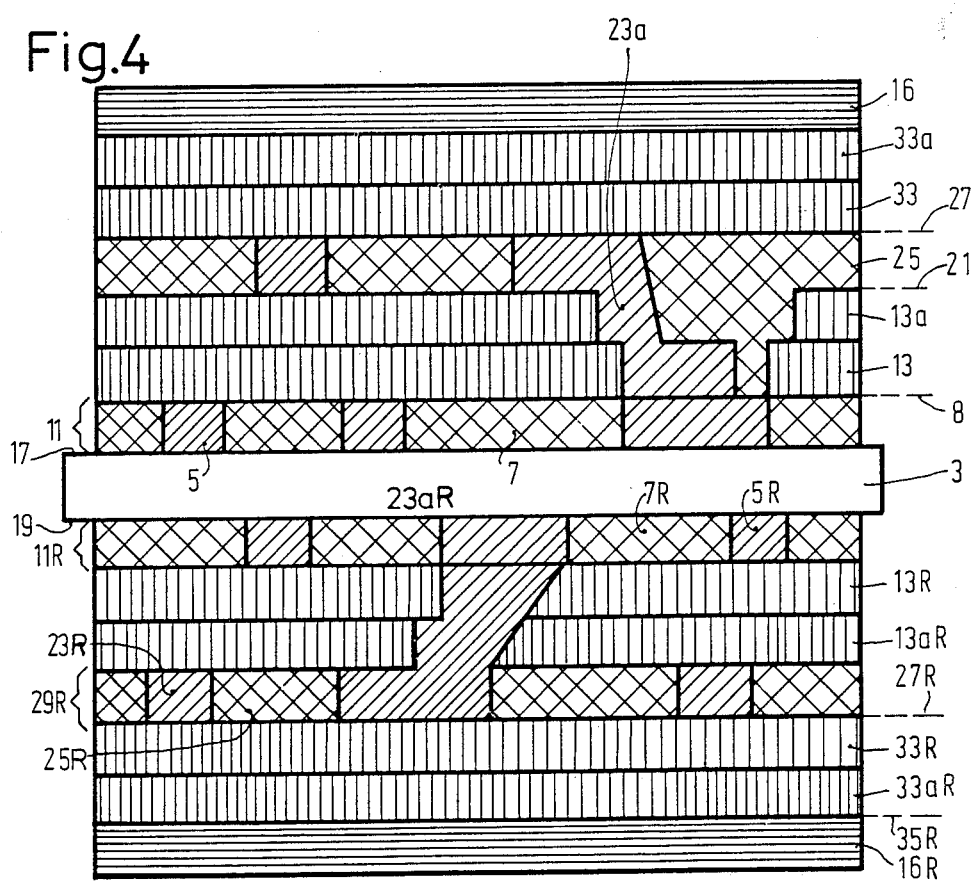
Figure 6:
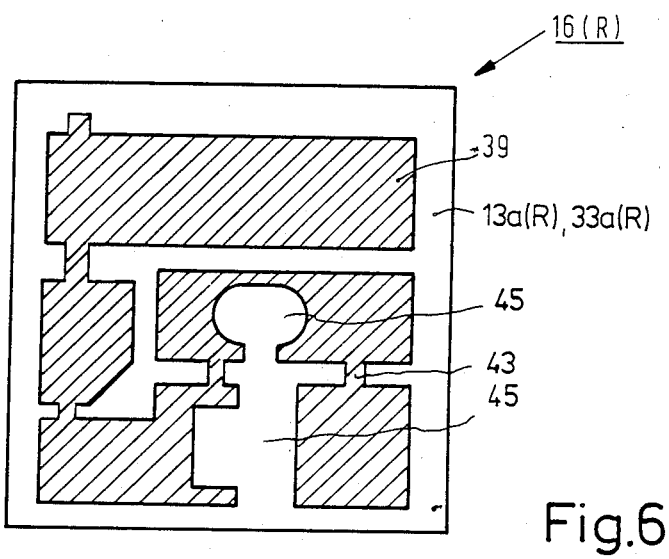

The invention will now be described in greater detail with reference to the drawings, in which FIG. 1 shows a ceramic substrate plate safeguarded against unauthorized access and having a conductor path layer, a filling layer and a smoothing layer on the front of the plate, FIG. 2 shows a ceramic substrate plate according to FIG. 1 having a similar circuit structure on the front and the rear sides safeguarding the circuit arrangement against access, FIG. 3 shows a ceramic substrate plate according to FIG. 1 having a multiple conductor path system with multiple compensating layers, FIG. 4 shows a ceramic substrate plate according to FIG. 3 having a similar construction on the front and rear sides, FIG. 5 is an example of a second substantially flat anti-access layer, FIG. 6 shows a second anti-access layer having an electric structure.

Figure 7:
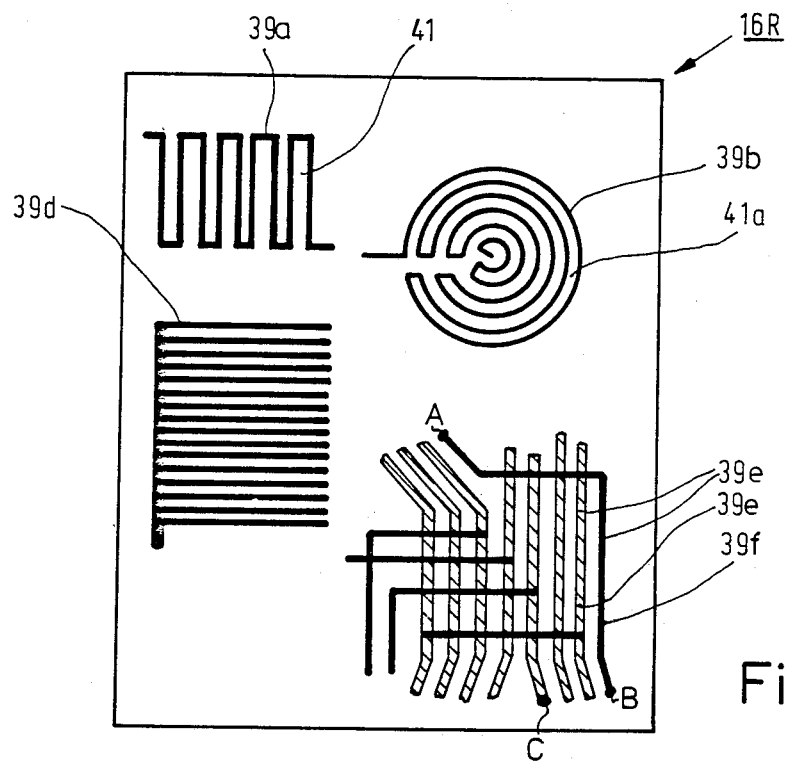

FIG. 7 is an example of a substantially structured antiaccess layer having several variants of electric conductor structures.

In order to safeguard a thick-film circuit arrangement on a thick-film substrate plate 3 against unauthorized access, for example by intruders, the layers are formed in a particular manner on a substrate plate 3 shown in FIG. 1.

First of all the conductor paths 5 which are formed by sintering a conductive paste are present directly on the substrate plate. The intermediate spaces between the conductor paths are filled with a thick-film filling layer 7 which is formed by sintering a nonconductive thick-film paste which is the starting basis of the filling layer and is provided in the intermediate spaces. The thick-film paste may be, for example, a thick-film glass paste. The tops of the conductor paths 5 and of the filling layer 7 filling the intermediate spaces between them are situated in a plane 8 extending substantially above the parts of the substrate plate to be covered. This combined conductor-filling layer 11 is covered by means of an insulating first thick-film anti-access layer 13 which will hereinafter be referred to as smoothing layer 13. The smoothing layer 13 extends in a covering manner over the combined conductor/filling layer 11. The top 15 of the smoothing layer 13 is smooth. The formation of the smoothing layer 13 may be done, for example, in that first an insulating thick-film paste is provided substantially over the entire surface of the substrate plate 3 in a surface-covering manner, it being ensured that the paste flows uniformly to form a flat top surface 15. A second thick-film anti-access layer 16 which will hereinafter be referred to as functional layer 16 and will be explained in greater detail hereinafter is provided on the top. The functional layer 16 may additionally obscure the underlying arrangement in accordance with the requirements of the access safety.

While the covering provided on the front 17 of the ceramic plate 13 protects the circuit arrangement on the front 17, the circuit arrangement is protected from the rear side 19 by the ceramic substrate plate. The ceramic substrate plate consists of a continuous uniform material through which in principle information on the mode of functioning of the circuit arrangement could be read on the front 17 by means of suitable methods, for example drilling. In order to further increase the access safety of the circuit arrangement better than the protection already resulting from the material property of the ceramic substrate plate, both the front 17 and the rear part 19 of the ceramic circuit plate 3 are provided with an anti-access covering in the embodiment shown in FIG. 2. The construction of the cover on the rear side should preferably correspond to the construction on the front. Accordingly, conductor paths 5R are provided on the rear side 19 of the ceramic circuit plate. The cavities between the conductor paths 5R are covered by means of the filling layer 7R. An insulating smoothing layer 13R is provided on the resulting plane 8R. A functional layer 16R is agaіnt present over the compensating layer 13R.

In thick-film circuit arrangements it is generally inevitable, due to the compact wiring, that there are several conductor path planes. Different conductor path planes are formed so that the conductor situated thereon at the crossing area is separated from the underlying conductor by typically two interposed insulating layers lying one on top of the other. The insulating layers consist, for example, of thick-film glass pastes. It is shown in FIG. 3 how in the present thick-film circuit arrangement a flat covering is provided by means of two smoothing layers 13 and 13a over the parts of the substrate plate 3 to be covered. This is of advantage because during sintering unevenesses may be formed again which can be better smoothed by two smoothing layers 13 and 13a. The two smoothing layers 13 and 13a are formed in the same manner. On the top 21 of the flat smoothing layer 13a a further conductor path plane may be provided. The conductors 23 of this plane may be contacted in the desired places to underlying conductors 5 via a bridge 23a. The intermediate spaces between the conductors 23 are also filled again with a filling mass 25 so that the top 27 of the combined layer 29 of conductors 23 and filling mass 25 is substantially smooth over the parts of the ceramic substrate plate 3 to be covered.

The combined conductor/filling layer 29 is now covered again by means of at least one, preferably two, smoothing layers 33 and 33a which are formed in the same manner and have a flat surface just like the smoothing layers 13 and 13a. In this manner a coating has been formed whose conductor pattern cannot be recognized from without or cannot be established by simple scratching or drilling.

In order to further improve the access safety a functional layer 16 is provided on the top 35 of the smoothing layer 33a. The functional layer 16 may again be formed differently.

FIG. 4 shows, in accordance with FIG. 2, a construction in which on the front 17 a coating according to FIG. 3 is provided which is completed on the rear side 19 by a corresponding layer according to FIG. 3. Accordingly, a layer 11R with conductors 5R, between which filling mass 7R is provided, is present on the rear side 19 as well as on the front 17. The layer 11R is covered by smoothing layers 13R and 13aR. Over the layer 13aR a further combined conductor filling layer 29R with conductors 23R and the filling mass 25R filling the intermediate spaces is present. The top 27R is again covered with smoothing layers 33R and 33aR. The top 35R of the smoothing layer 33aR is then covered again with a functional layer 16R. As on the front, on which a bridge 23a is shown, a bridge 23aR is also provided on the rear side.

A simple construction of functional layers 16 and 16R, respectively, is shown in FIG. 5. In this case the functional layer 16(R) consists of an electrically conductive layer 37 which is provided on a large area and, for example, consists of a sintered thick-film resistance material.

FIG. 6 shows a functional layer 16(R) which has a simple conductor structure 39. Areas to be protected are covered above the top compensating layer 13R, 33aR with sintered resistance surfaces 39. The individual resistance surfaces are connected together via conductor paths 43. Special recesses 45 are present, for example, in places of integrated circuits. These are provided only after sintering the substrate and, for example, are covered with epoxide resin.

FIG. 7 shows another embodiment of the functional layers 16 and 16R, respectively. This functional layer 16R consists, as shown in the Figure, top left, either in part of totally, a meanderlike conductive layer 39a which either has a certain inner resistance (resistance pastes) or is completely conductive (conductor path pastes). The intermediate spaces between these structures may again be filled, as in the preceding Figures, with filling mass 41 in accordance with the layers 11R and 29R. As is shown in FIG. 7, top right, the conductor path may also be formed helically as is indicated by 39b. Intermediate spaces 41a are again filled with filling mass in accordance with layers 11R and 29R. FIG. 7, bottom left, shows the conductor structure 39d in the form of a comb.

In the right bottom part of FIG. 7 an embodiment is shown of the functional layer 16 which has for its object to prevent the gaining of information about the circuit arrangement with rays, for example, X-rays, penetrating through the material.

At least the hatched structures 39a are to be provided in this case in such a manner that they are not visually recognizable. Due to the small distance to the solid structures 39f in an overlying layer of conductor structures these cannot be separated spatially from the upper structures in the direction at right angles to the substrate plate by means of the known arrangements for analysis with penetrating rays. It can therefore not be recognized with such techniques if, and if so which, partial structures are electrically conductively connected together. These structures may also be used with large or small areas.

Another embodiment for this purpose may consist in that similar material is provided in an upper structure which is visually not recognizable at the area of the intermediate spaces between the parts of the lower structure. In this case a flat similar area is obtained which does not show inner structures with penetrating rays.

Also the arrangement shown in FIG. 7, lower right, is structured as a kind of confusion circuit. The construction may be chosen to be so that parts of the functional layer are integrated in the pattern of conductors. In a further modified embodiment it is feasible to provide the conductors of the confusing circuit in such a manner that, in the path of radiation of rays penetrating through the material in the original circuit, circuit arrangements are shown which actually do not exist at all.

The geometrical construction of the functional layer may also be chosen to be so that due to its presence the original pattern is concealed or that it cannot be recognized in the transmission how the original pattern is constructed. Also it cannot be recognized in the transmission whether the conductor connection between a point A and B or between A and C exists since in the transmission a superposition and bifurcation of the original and the imaginary conductor paths is present and in a transmission a distinction between top and bottom is not possible as a result of the small difference in height of a few micrometers.

Summarizing, it may be said with reference to FIG. 7, bottom right, that the functional layer structures with respect to the underlying original conductor path structures are constructed so that in a parallel projection of the functional layer structure on the original conductor path structures linkages between the individual components of the circuit arrangement occur as the sum of the two structures which, for a third partly not knowing the mode of functioning of the circuit, cannot be established as such, which electric linkages are suggested only by the correspondingly structured functional layer. This functional layer sample which is constructed and positioned in accordance with the original conductor pattern sample of the circuit arrangement in investigations with rays penetrating through the material impedes the analysis of the X-ray patterns of the circuit arrangement to a high extent. This is particularly importance since an absolute protection against penetration investigations is not possible according to the present state of the art. Lead covers also are unsafe since they are necessarily very thin and hence not completely absorbing and cannot be bonded to the sintered pastes so as to be undetachable. Also what matters is that so much confusion is found in the transmission that decoding requires so much work and time that the intention to interfere or to encode begins to fade away and induces third parties to stop the attempt.

This also applies to the case of mechanical and electrical test experiments when the conductor structures 39 to 39 f engage in the electronic circuit of the circuit arrangement in functional-specific places. When the electrically conductive structures 39 to 39f are interrupted or short-circuited by such experiments the circuit arrangement, for example, is constructed so that either it stops functioning completely (for example, by loss of memory) or even is moved to an error function (wrong programming) by the manipulation. When, for example the circuit function is then changed in that, by triggering a reset function, storage capacity is erased or processors are moved in a position in which the original function can no longer be recognized or also by excess voltages and currents then occurring, the function of central components may be disturbed or destroyed. Several types of conductor paths of the functional layer 16R may be combined with each other. In this connection it is advantageous when the voltage supply for the integrated switching circuits occur through the functional layer or layers. Interference of such supply may lead to the irreparable defects already described.

What is claimed is:

1. In a thick-film circuit arrangement having an electronic circuit comprising a ceramic substrate, at least one thick-film conductor arrangement of conductor paths and integrated circuit components disposed on at least one surface of said ceramic substrate, said thick-film conductor arrangement having intermediate spaces between said conductor paths and said integrated circuit components, and at least one sintered non-conducting paste disposed in said intermediate spaces of said one thick-film conductor arrangement on said at least one surface of said ceramic substrate, the improvement comprising said thick-film conductor arrangement and said sintered non-conducting paste both having substantially the same height above said at least one surface of said ceramic substrate, and at least one thick-film anti-access layer disposed on said thick-film conductor arrangement and said sintered non-conducting paste, said at least one thick-film anti-access layer having observation impeding inclusions to prevent optical recognition of said thick-film conductor arrangement, wherein at least a second thick-film anti-access layer is disposed on said at least one thick-film anti-access layer.

2. A thick-film circuit arrangement according to claim 1, wherein at least a second thick-film conductor arrangement and at least a second sintered non-conducting paste are disposed on said second thick-film anti-access layer, and wherein at least a third thick-film anti-access layer is disposed on said second thick-film conductor arrangement and said second sintered non-conducting paste.

3. A thick-film circuit arrangement according to claim 2, wherein a fourth thick-film anti-access layer is disposed on said third thick-film anti-access layer.

4. A thick-film circuit arrangement according to claim 18 or claim 19 or claim 3, wherein at least one further thick-film conductor arrangement and at least one further sintered non-conducting paste are disposed on a second surface of said ceramic substrate, and wherein at least one further thick-film anti-access layer is disposed on both said further thick-film conductor arrangement and said further sintered non-conducting paste, said further thick-film conductor arrangement and said further sintered non-conducting paste extending substantially at the same height above said second surface of said ceramic substrate.

5. A thick-film circuit arrangement according to claim 4, wherein at least a second further thick-film anti-access layer is disposed on said at least one further thick-film anti-access layer.

6. A thick-film circuit arrangement according to claim 5, wherein at least a second further thick-film conductor arrangement and at least a second further sintered non-conducting paste are disposed on said second further thick-film anti-access layer, and wherein at least a third further thick-film anti-access layer is disposed on said second further thick-film conductor arrangement and said second further sintered non-conducting paste.

7. A thick-film circuit arrangement according to claim 6, wherein a fourth further thick-film anti-access layer is disposed on said third further thick-film anti-access layer.

8. A thick-film circuit arrangement according to claim 4, wherein at least those ones of said thick-film anti-access layers and said further thick-film anti-access layers disposed outwardly of said ceramic substrate include electrically conductive structures, said electrically conductive structures at least partially masking portions of said conductor paths and integrated circuit components of both underlying thick-film conductor arrangements and underlying further thick-film conductor arrangements.

9. A thick-film circuit arrangement according to claim 8, wherein said electrically conductive structures enable formation of functional errors of said conductor paths and integrated circuit components during interruptions of said underlying thick-film conductor arrangements and said underlying further thick-film conductor arrangements.

10. A thick-film circuit arrangement according to claim 9, wherein said electrically conductive structures include one of a meander pattern, a comb pattern, a coil pattern, and a switching pattern.

11. A thick-film circuit arrangement according to claim 8, wherein said electrically conductive structures mask said underlying thick-film conductor arrangements and said underlying further thick-film conductor arrangements from material-penetrating rays.

12. A thick-film circuit arrangement according to claim 8, wherein said electrically conductive structures include means for supplying voltage and current to said integrated circuits.

13. A thick-film circuit arrangement according to claim 4, wherein said at least one sintered non-conducting paste and said at least one further sintered non-conducting paste include a sintered thick-film glass material.

14. A thick-film circuit arrangement according to claim 4, wherein said at least one thick-film anti-access layer and said at least one further thick-film anti-access layer include a sintered thick-film glass material.

15. A thick-film circuit arrangement according to claim 5, wherein said second of said thick-film anti-access layer and said second of said further thick-film anti-access layer include at least one partial surface of a thick-film conductor and resistance paste.

16. A thick-film circuit arrangement according to claim 18 or claim 19 or claim 3, wherein at least those ones of said thick-film anti-access layers disposed outwardly of said ceramic substrate include electrically conductive structures, said electrically conductive structures at least partially masking portions of said conductor paths and integrated circuit components of underlying thick-film conductor arrangements.

17. A thick-film circuit arrangement according to claim 16, wherein said electrically conductive structures enable formation of functional errors of said conductor paths and integrated circuit components during interruptions of said underlying thick-film conductor arrangements.

18. A thick-film circuit arrangement according to claim 17, wherein said electrically conductive structures include one of a meander pattern, a comb pattern, a coil pattern, and a switching pattern.

19. A thick-film circuit arrangement according to claim 16, wherein said electrically conductive structures mask said underlying thick-film conductor arrangements from material-penetrating rays.

20. A thick-film circuit arrangement according to claim 16, wherein said electrically conductive structures include means for supplying voltage and current to said integrated circuits.

21. A thick-film circuit arrangement according to claim 18 or claim 19 or claim 3, wherein said at least one sintered non-conducting paste includes a sintered thick film-glass material.

22. A thick-film circuit arrangement according to claim 1 or claim 2 or claim 3, wherein said at least one thick-film anti-access layer includes a sintered thick-film glass material.

23. A thick-film circuit arrangement according to claim 1, wherein said second of said thick-film anti-access layer includes at least one partial surface of a thick-film conductor and resistance paste.

24. In a thick-film circuit arrangement having an electronic circuit comprising a ceramic substrate, at least one thick-film conductor arrangement of conductor paths and integrated circuit components disposed on at least one surface of said ceramic substrate, said thick-film conductor arrangement having intermediate spaces between said conductor paths and said integrated circuit components, and at least one sintered non-conducting paste disposed in said intermediate spaces of said one thick-film conductor arrangement on said at least one surface of said ceramic substrate, the improvement comprising said thick-film conductor arrangement and said sintered non-conducting paste both having substantially the same height above said at least one surface of said ceramic substrate, and at least one thick-film anti-access layer disposed on said thick-film conductor arrangement and said sintered non-conducting paste, said at least one thick-film anti-access layer having observation impeding inclusions to prevent optical recognition of said thick-film conductor arrangement, wherein at least one further thick-film conductor arrangement and at least one further sintered non-conducting paste are disposed on a second surface of said ceramic substrate, and wherein at least one further thick-film anti-access layer is disposed on both said further thick-film conductor arrangement and said further sintered non-conducting paste, said further thick-film conductor arrangement and said further sintered non-conducting paste extending substantially at the same height above said second surface of said ceramic substrate.

25. A thick-film circuit arrangement according to claim 24, wherein at least a second further thick-film anti-access layer is disposed on said at least one further thick-film anti-access layer.

26. A thick-film circuit arrangement according to claim 25, wherein at least a second further thick-film conductor arrangement and at least a second further sintered non-conducting paste are disposed on said second further thick-film anti-access layer, and wherein at least a third further thick-film anti-access layer is disposed on said second further thick-film conductor arrangement and said second further sintered non-conducting paste.

27. A thick-film circuit arrangement according to claim 26, wherein a fourth further thick-film anti-access layer is disposed on said third further thick-film anti-access layer.

28. A thick-film circuit arrangement according to claim 24, wherein at least those ones of said thick-film anti-access layers and said further thick-film anti-access layers disposed outwardly of said ceramic substrate include electrically conductive structures, said electrically conductive structures at least partially masking portions of said conductor paths and integrated circuit components of both underlying thick-film conductor arrangements and underlying further thick-film conductor arrangements.

29. A thick-film circuit arrangement according to claim 28, wherein said electrically conductive structures enable formation of functional errors of said conductor paths and integrated circuit components during interruptions of said underlying thick-film conductor arrangements and said underlying further thick-film conductor arrangements.

30. A thick-film circuit arrangement according to claim 29, wherein said electrically conductive structures include one of a meander pattern, a comb pattern, a coil pattern, and a switching pattern.

31. A thick-film circuit arrangement according to claim 28, wherein said electrically conductive structures mask said underlying thick-film conductor arrangements and said underlying further thick-film conductor arrangements from material-penetrating rays.

32. A thick-film circuit arrangement according to claim 28, wherein said electrically conductive structures include means for supplying voltage and current to said integrated circuits.

33. A thick-film circuit arrangement according to claim 24, wherein said at least one sintered non-conducting paste and said at least one further sintered non-conducting paste include a sintered thick-film glass material.

34. A thick-film circuit arrangement according to claim 24, wherein said at least one thick-film anti-access layer and said at least one further thick-film anti-access layer include a sintered thick-film glass material.

35. A thick-film circuit arrangement according to claim 25, wherein said second of said thick-film anti-access layer and said second of said further thick-film anti-access layer include at least one partial surface of a thick-film conductor and resistance paste.

36. In a thick-film circuit arrangement having an electronic circuit comprising a ceramic substrate, at least one thick-film conductor arrangement of conductor paths and integrated circuit components disposed on at least one surface of said ceramic substrate, said thick-film conductor arrangement having intermediate spaces between said conductor paths and said integrated circuit components, and at least one sintered non-conducting paste disposed in said intermediate spaces of said one thick-film conductor arrangement on said at least one surface of said ceramic substrate, the improvement comprising said thick-film conductor arrangement and said sintered non-conducting paste both having substantially the same height above said at least one surface of said ceramic substrate, and at least one thick-film anti-access layer disposed on said thick-film conductor arrangement and said sintered non-conducting paste, said at least one thick-film anti-access layer having observation impeding inclusions to prevent optical recognition of said thick-film conductor arrangement, wherein at least those ones of said thick-film anti-access layers disposed outwardly of said ceramic substrate include electrically conductive structures, said electrically conductive structures at least partially masking portions of said conductor paths and integrated circuit components of underlying thick-film conductor arrangements.

37. A thick-film circuit arrangement according to claim 26, wherein said electrically conductive structures enable formation of functional errors of said conductor paths and integrated circuit components during interruptions of said underlying thick-film conductor arrangements.

38. A thick-film circuit arrangement according to claim 37, wherein said electrically conductive structures include one of a meander pattern, a comb pattern, a coil pattern, and a switching pattern.

39. A thick-film circuit arrangement according to claim 36, wherein said electrically conductive structures mask said underlying thick-film conductor arrangements from material-penetrating rays.

40. A thick-film circuit arrangement according to claim 36, wherein said electrically conductive structures include means for supplying voltage and current to said integrated circuits.

41. In a thick-film circuit arrangement having an electronic circuit comprising a ceramic substrate, at least one thick-film conductor arrangement of conductor paths and integrated circuit components disposed on at least one surface of said ceramic substrate, said thick-film conductor arrangement having intermediate spaces between said conductor paths and said integrated circuit components, and at least one sintered non-conducting paste disposed in said intermediate spaces of said one thick-film conductor arrangement on said at least one surface of said ceramic substrate, the improvement comprising said thick-film conductor arrangement and said sintered non-conducting paste both having substantially the same height above said at least one surface of said ceramic substrate, and at least one thick-film anti-access layer disposed on said thick-film conductor arrangement and said sintered non-conducting paste, said at least one thick-film anti-access layer having observation impeding inclusions to prevent optical recognition of said thick-film conductor arrangement, wherein said at least one sintered non-conducting paste includes a sintered thick-film glass material.

42. In a thick-film circuit arrangement having an electronic circuit comprising a ceramic substrate, at least one thick-film conductor arrangement of conductor paths and integrated circuit components disposed on at least one surface of said ceramic substrate, said thick-film conductor arrangement having intermediate spaces between said conductor paths and said integrated circuit components, and at least one sintered non-conducting paste disposed in said intermediate spaces of said one thick-film conductor arrangement on said at least one surface of said ceramic substrate, the improvement comprising said thick-film conductor arrangement and said sintered non-conducting paste both having substantially the same height above said at least one surface of said ceramic substrate, and at least one thick-film anti-access layer disposed on said thick-film conductor arrangement and said sintered non-conducting paste, said at least one thick-film anti-access layer having observation impeding inclusions to prevent optical recognition of said thick-film conductor arrangement, wherein said at least one thick-film anti-access layer includes a sintered thick-film glass material.

* * * * *